United States Patent
Chien

(10) Patent No.: US 6,271,770 B1
(45) Date of Patent: Aug. 7, 2001

(54) MECHANICAL CODER

(76) Inventor: Chien-Chun Chien, 3F-3, No.10, Yu Nung Rd., Shih Lin Dist., Taipei (TW)

( * ) Notice: Subject to any disclaimer, the term of this patent is extended or adjusted under 35 U.S.C. 154(b) by 0 days.

(21) Appl. No.: 09/343,675

(22) Filed: Jun. 30, 1999

(51) Int. Cl.$^7$ ............................................. H03M 1/22
(52) U.S. Cl. ............................................................. 341/16
(58) Field of Search ............................................ 341/1–16

(56) References Cited

U.S. PATENT DOCUMENTS

| | | | |
|---|---|---|---|
| 2,974,316 | * | 3/1961 | Guidal et al. ........................... 341/16 |
| 3,024,990 | * | 3/1962 | Magnuson ............................... 341/16 |
| 3,206,740 | * | 9/1965 | Maclay .................................... 341/16 |
| 4,240,069 | * | 12/1980 | Hullein et al. ......................... 341/16 |

* cited by examiner

*Primary Examiner*—Michael Tokar
*Assistant Examiner*—Don Phu Le

(57) ABSTRACT

The present invention relates to a mechanical coder. The mechanical coder includes a gear-shaped and conductive signal-separating wheel having a plurality of recesses. Each of the recesses of the signal-separating wheel is filled with insulating material to form a plurality of insulating portions. The surface of the signal-separating wheel is smooth so that the topography is avoided. The mechanical coder further includes a terminal module consisting of a first terminal, a second terminal and a common terminal. The common terminal is coupled to the conductive portion so that the common terminal is normally "ON". The first terminal and the second terminal are coupled to the opposite side of the signal-separating wheel, respectively. Thus the first terminal receives an "ON" signal and the second terminal receives an "OFF" signal or the first terminal receives an "OFF" signal and the second terminal receives an "ON" signal while the signal-separating wheel is rotating. Owing to the signal-separating wheel is smooth so that the obstruction against the first terminal or the second terminal is reduced. Hence, the precision of signal that the terminal module receives is raised. Additionally, the yield is improved.

1 Claim, 5 Drawing Sheets

(A)

(B)

(C)

(D)

MECHANICAL CODER

BACKGROUND OF THE INVENTION

1. Field of the Invention

The present invention relates a coder, and more particularly, to a mechanical coder.

2. Description of the Prior Art

Referring to FIG. 1, which depicts a conventional obstructing type coder including an emitter 10, a receiver 20 and an optical shutter 30. The optical shutter 30 is made of opaque material. A plurality of rectangular openings 31 are formed on the periphery of the optical shutter 30. While the optical shutter 30 is rotating, the light emitted by the emitter 10 may pass through the openings 31 or be interdicted by the opaque optical shutter 30. As the light emitted from the emitter 10 passes through the openings 31, the receiver 20 accepts an "ON" signal. Conversely, as the light emitted from the emitter 10 is interdicted by the opaque optical shutter 30, the receiver 20 receives an "OFF" signal. Thus, a plurality of "ON" signals and a plurality of "OFF" signals constitute a continuous light-and-shade signal having constant interval. The light-and-shade signal is received and then transferred into a digital logic signal for output.

In order to increase the resolution, increasing the number of the shutter 32 is desired. However, the more the numbers of shutters 32, the more serious is the problem caused by scattering and diffraction. Scattering and diffraction will result in the difficulty in clarifying "ON" signal or "OFF" signal. Thus the receiver 20 to judge the received signal exactly. Hence it is difficult to increase the resolution without limits.

Referring to FIG. 2, which depicts another conventional guidance type coder including an emitter 10, a receiver 20 and an optical shutter 30 made of transparent material. There are a plurality of gear-shaped projections 33 and a plurality of recesses 34 formed on the periphery of the optical shutter 30. Additionally, there are a plurality of refraction planes 35 formed on the inner portion of the optical shutter 30. While the optical shutter 30 is rotating, the light emitted by the emitter 10 may be refracted to projections 33 or recesses 34. As the light emitted by the emitter 10 is refracted to projections 33, the receiver 20 accepts an "ON" signal. Conversely, as the light emitted by the emitter 10 is refracted to recesses 34, the receiver 20 receives an "OFF" signal. Thus, a plurality of "ON" signals and a plurality of "OFF" signal constitute a continuous light-and-shade signal having a constant interval. The light-and-shade signal is received and then transferred into a digital logic signal for output.

The resolution of the guidance type coder is higher than that of the above-mentioned obstructing-type coder. However, the optical distance of the guidance type coder is longer than that of above-mentioned obstructing type coder because that the light is indirectly guided to the receiver 20. Moreover, before the receiver 20 the refracted light, the light has grown weaker already. In order to prevent the light guided to the receiver 20 from being attenuated, the intensity of the emitter 10 must be increased. More power consumption is needed and the lifetime of emitter 10 is shortened.

Referring to FIG. 3, a traditional mechanical coder is depicted. The traditional mechanical coder consists of a signal-separating wheel 40, a common terminal 54, a first terminal 52 and a second terminal 53. Additionally, there are a first conductive portion 41, a plurality of second conductive portions 42, a plurality of third conductive portions 43 and an insulating portion 43 formed on a main surface of the signal-separating wheel 40 having a disk-shaped outline. It is worth noting that there are several ladders formed of one second conductive portion 42 and one third conductive portion 43. That is, for the first terminal 52 and the second terminal 53, each of second conductive portions 42 and each of third conductive portions 43 are not on the same level. However, the common terminal 54, the first terminal 52 and the second terminal 53 are placed on the same level and coupled to the main surface of the signal-separating wheel 40. While the signal-separating wheel 40 is rotating, the first terminal 52 and the second terminal 53, placed on the same level, continuously receive the "ON" signal or the "OFF" signal, respectively. The "ON" signal and the "OFF" signal constitute a digital logic signal.

The advantages of the traditional mechanical coder include lower power consumption, non-scattering, non-diffraction and longer lifetime. The traditional mechanical coder is generally employed in the wireless device, notebook or the device requiring lower power consumption. However, the disadvantages of the traditional mechanical coder are identified as follows.

(1) The signal-separating wheel is made from a general PCB (printed circuit board). Then the signal-separating wheel is etched or stamped. Thus the thickness of the first conductive portion, the second conductive portion and the third conductive portion may be slightly different from that of the insulating portion. That is, there is an altitude formed between the conductive portion and the insulating portion. This will result in bounce of the terminal, which leads to unstable signal and errors in receiving the signal.

(2) Because the signal-separating wheel is etched or stamped, there are many sharp teeth formed on the boundary of the conductive portion and the insulating portion. This will cause an unstable signal and errors in receiving the signal.

(3) The required precision is high and the extra work is difficult to do, so the yield is low.

(4) The common terminal, the first terminal and the second terminal are placed on the same level, and they are coupled to the main surface of the signal-separating wheel, so they suppress the rotation of the signal-separating wheel.

SUMMARY OF THE INVENTION

The present invention discloses a mechanical coder including a signal-separating wheel. The signal-separating wheel is manufactured in the following manner. First, a gear-shaped portion made of conductive material is formed. Then the recess of the gear-shaped portion is filled with insulating material to completely form the signal-separating wheel having a smooth disk-shaped outline. Thus the bounce of the terminal, caused by the altitude formed between the conductive portion and the insulating portion, is avoided.

The present invention also includes a first terminal, a second terminal and a common terminal. The first terminal and the second terminal are coupled to the opposite sides of the signal-separating wheel, respectively, rather than being placed on the main surface of the signal-separating wheel. This arrangement prevents the suppression of the rotating of the signal-separating wheel.

The first terminal, the second terminal and the common terminal are combined to form a terminal module. Thus the assembling time and the production cost are reduced effectively. Additionally, the yield is improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
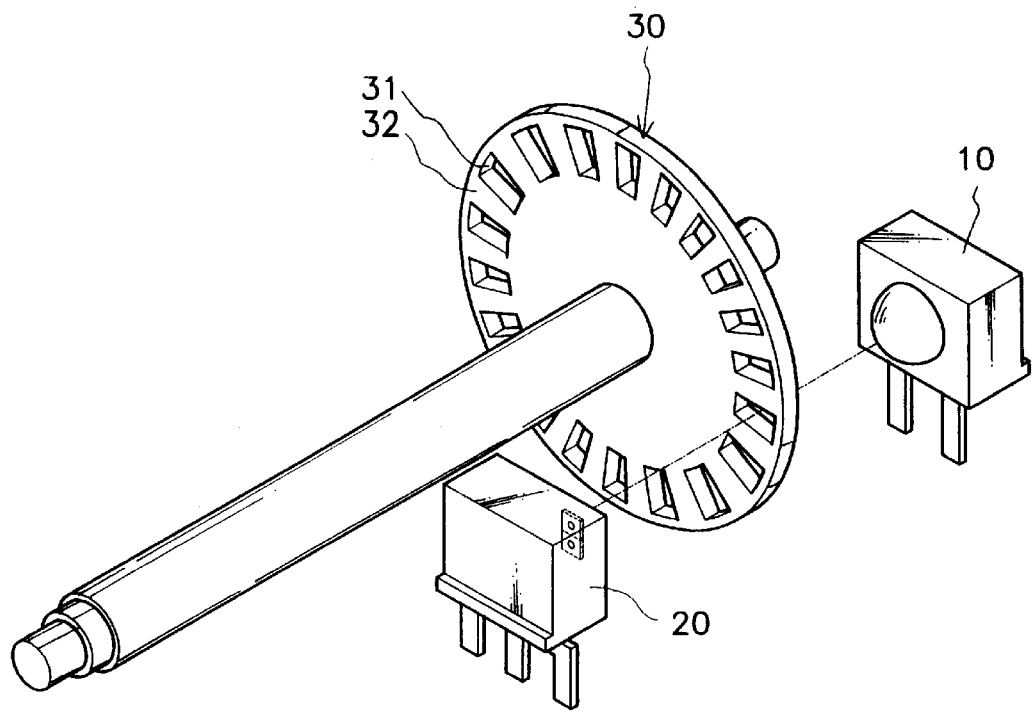
FIG. 1 depicts a conventional obstructing-type coder.
Figure 2:
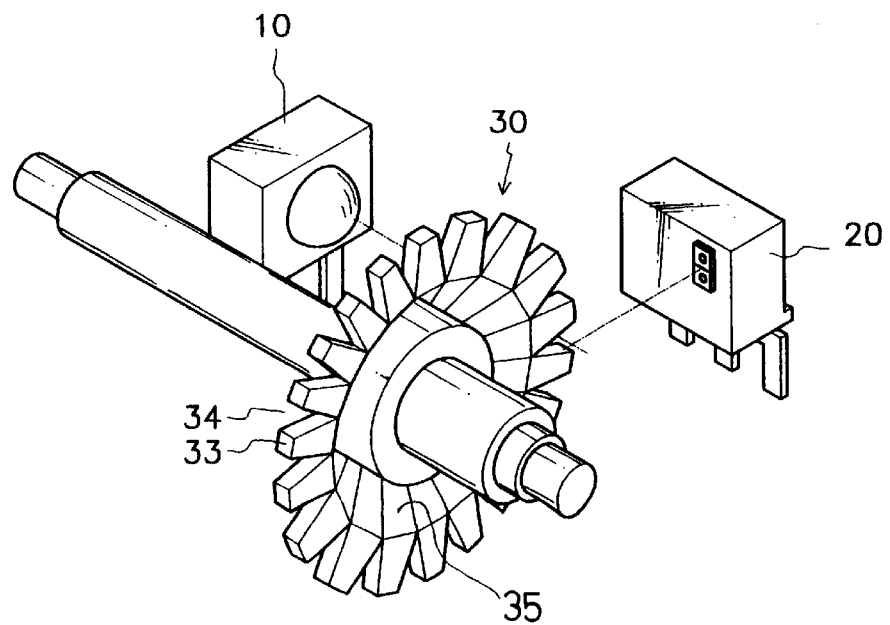
FIG. 2 depicts a conventional guidance-type coder.
Figure 3:
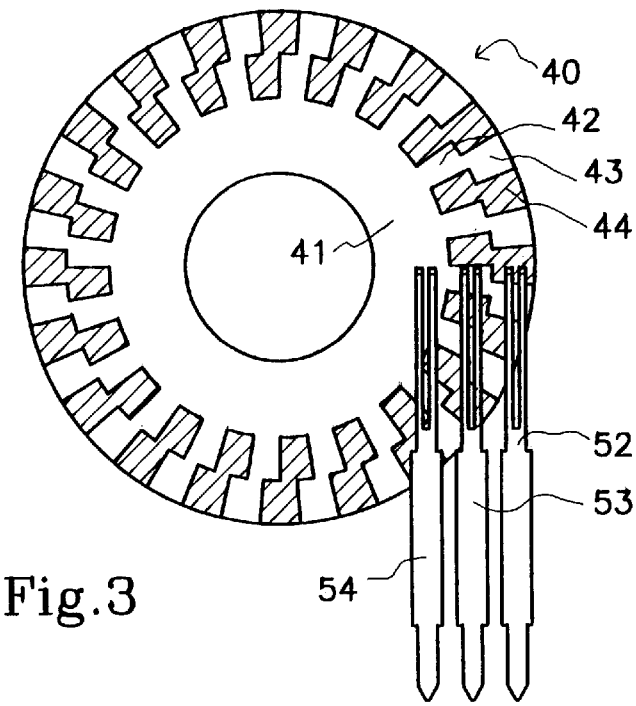
FIG. 3 depicts a traditional mechanical coder.
Figure 4:
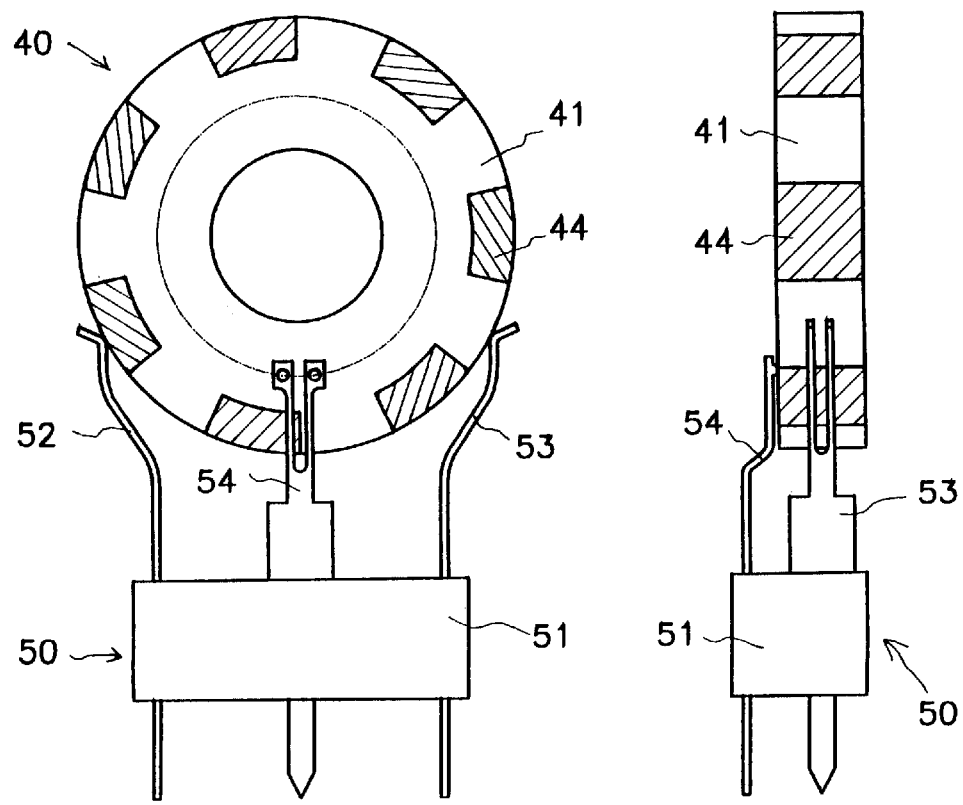
FIG. 4 depicts a top plan view and a side view of a mechanical coder embodying the present invention.

Referring to FIG. 4, the present invention provides a mechanical coder consisting of a signal-separating wheel 40 and a terminal module 50. The signal-separating wheel 40 is disk-shaped and is manufactured in the following manner. First, a first conductive portion 41 having a gear-shaped outline is formed. Then the recess of the first conductive portion 41 is filled with insulating material (such as plastic), serving as an insulating portion 44, to completely form the signal-separating wheel having a smooth disk-shaped outline. Owing to the fact that the signal-separating wheel is smooth, the bounce of the terminal, caused by the altitude formed on the interface between the conductive portion and the insulating portion, is eliminated.

Still referring to FIG. 4, the terminal module 50 includes a base 51, a first terminal 52, a second terminal 53 and a common terminal 54. The first terminal 52, the second terminal 53 and the common terminal 54 are fixed to form an assemblage by the base 51. An end of the common terminal 54 can touch the first conductive portion 41 on the main surface of the signal-separating wheel 40. As shown in FIG. 4, the end of the common terminal 54 is coupled to the region between the recess and the center of the signal-separating wheel 40 so that the common terminal 54 is unable to be in touch with the insulating portion 44. An end of the first terminal 52 and that of the second terminal 53 are coupled to the opposite sides of the signal-separating wheel 40, respectively. Because the arrangement of the insulating portion 44 is opposite to that of the recess of the first conductive portion 41, so that while the first terminal 52 touches the first conductive portion 41, the second terminal 53 touches the insulating portion. Similarly, while the first terminal 52 touches the insulating portion 44, the second terminal 53 touches the first conductive portion 41. That is, while the "ON" signal is received by the first terminal 52, the "OFF" signal is received by the second terminal 53. Hence, the phase-difference between the signal received by the first terminal 52 and that received by the second terminal 53 is 90°.

Figure 7:
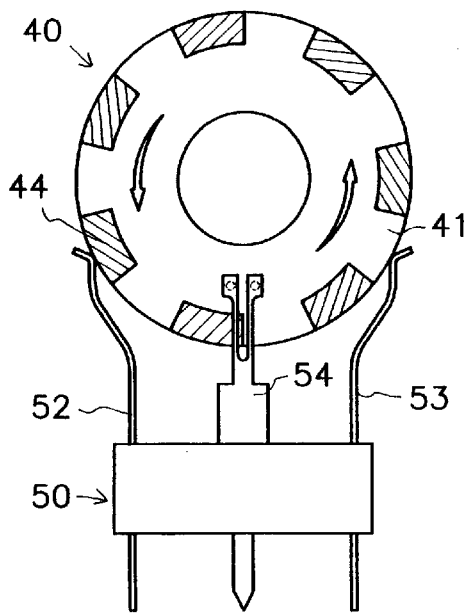
FIG. 7 depicts the motion of the embodiment shown in FIG. 4.
Figure 7:
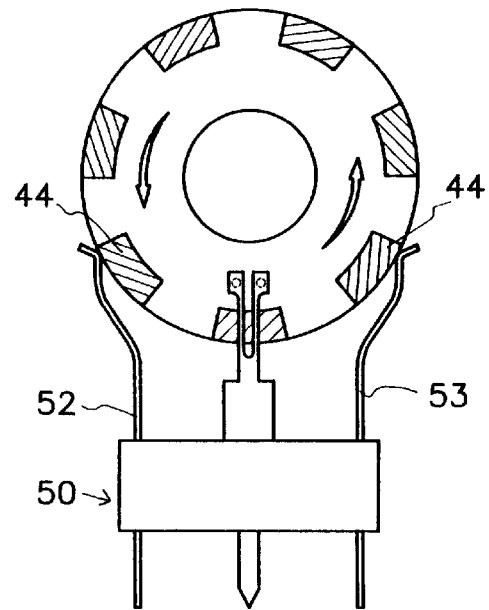
Figure 7:
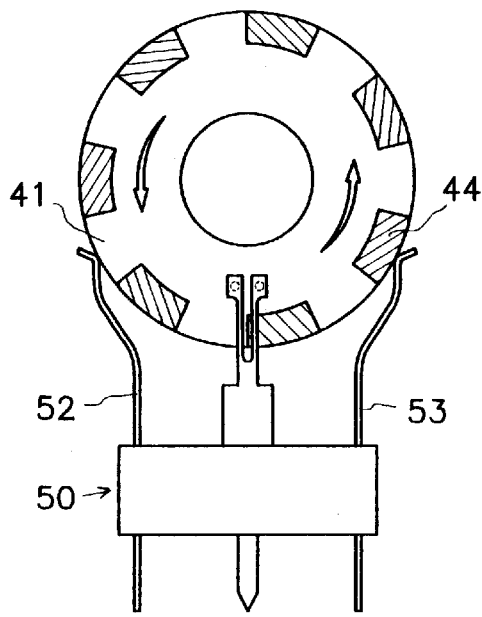
Figure 7:
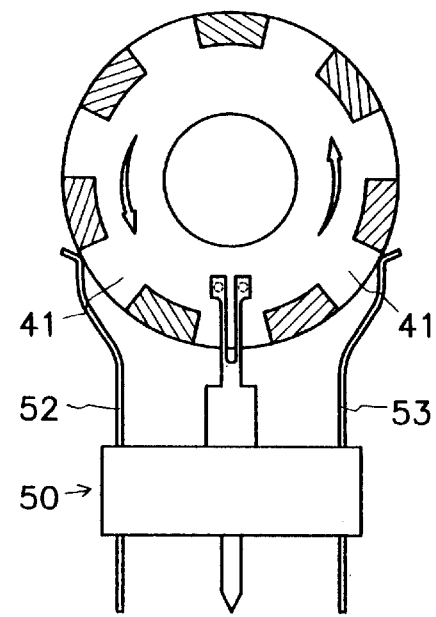

Referring to FIG. 7, which depicts the motion of the signal-separating wheel 40 shown in FIG. 4. While the signal-separating wheel 40 is rotating, the common terminal 54 is normally "ON" because the end of the common terminal 54 is coupled to the region between the recess and the center of the signal-separating wheel 40. On the contrary, because of being coupled to the side of the signal-separating wheel 40, the first terminal 52 can continuously receive an "ON" signal (or a "1" signal) caused by the first conductive portion 41 or an "OFF" signal (or an "0" signal) caused by the insulating portion 44. Similarly, the second terminal 53 can continuously receive the "ON" signal or the "OFF" signal. The "ON" signal and the "OFF" signal constitute a continuous square wave, whose phase-difference is 90°. The square wave above is a digital logic signal so that the integrated circuit (IC) can be responsive to it. As shown in FIG. 4(A), while the first terminal 52 is coupled to the insulating portion 44 and the second terminal 53 is coupled to the first conductive portion 41, the first terminal 52 receives the "0" signal and the second terminal 53 receives the "1" signal, respectively. As shown in FIG. 4(B), while the first terminal 52 and the second terminal 53 are coupled to the insulating portion 44, both the first terminal 52 and the second terminal 53 receive the "0" signal. As shown in FIG. 4(C), while the first terminal 52 is coupled to the first conductive portion 41 and the second terminal 53 is coupled to the insulating portion 44, the first terminal 52 receives the "1" signal and the second terminal 53 receives the "0" signal, respectively. As shown in FIG. 4(D), while the first terminal 52 and the second terminal 53 are coupled to the first conductive portion 41, both the first terminal 52 and the second terminal 53 receive the "1" signal. The repeat of foregoing square wave constitutes an signal consisting of (0,1), (0,0), (1,0) and (1,1).

Figure 5:
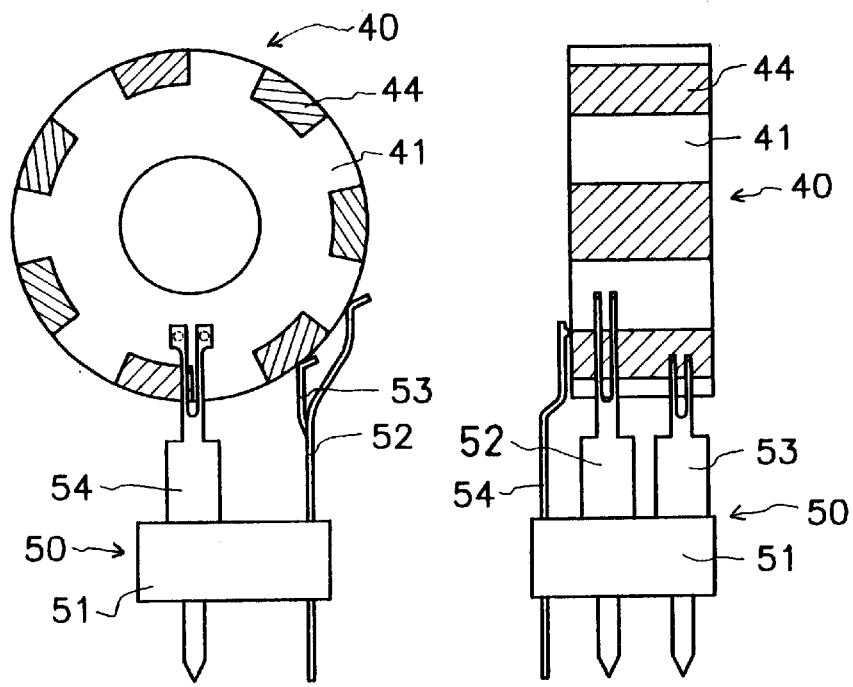
FIG. 5 depicts a preferred embodiment of the present invention.

Referring to FIG. 5, another preferred embodiment of the present invention is depicted. First, the gear-shaped signal-separating wheel 40 is formed and made of conductive material. Then, the recess of the signal-separating wheel 40 filled with the insulating material to form a plurality of insulating portions 44.

Still referring to FIG. 5, the terminal module 50 also includes the base 51, the first terminal 52, the second terminal 53 and the common terminal 54. An end of the common terminal 54 is coupled to the first conductive portion 41, on the main surface of the center of the signal-separating wheel 40, so that the common terminal 54 is normally "ON". An end of the first terminal 52 and that of the second terminal 53 are coupled to the same side of the signal-separating wheel 40. However, the position that the first terminal 52 coupled to the signal-separating wheel 40 and that of the second terminal 53 coupled to the signal-separating wheel 40 are different. That is, the position of the first terminal 52 and that of the second terminal 53 are at the different level, respectively. The different level results in a 90° phase-difference between the signal received by the first terminal 52 and that of the second terminal 53. Through rotating the signal-separating wheel 40, the first terminal 52 and the second terminal 53 can receive the "ON" signal or the "OFF" signal, respectively. The "ON" signal and the "OFF" signal constitute a continuous digital logic signal so that the integrated circuit (IC) can be responsive to it.

Figure 6:
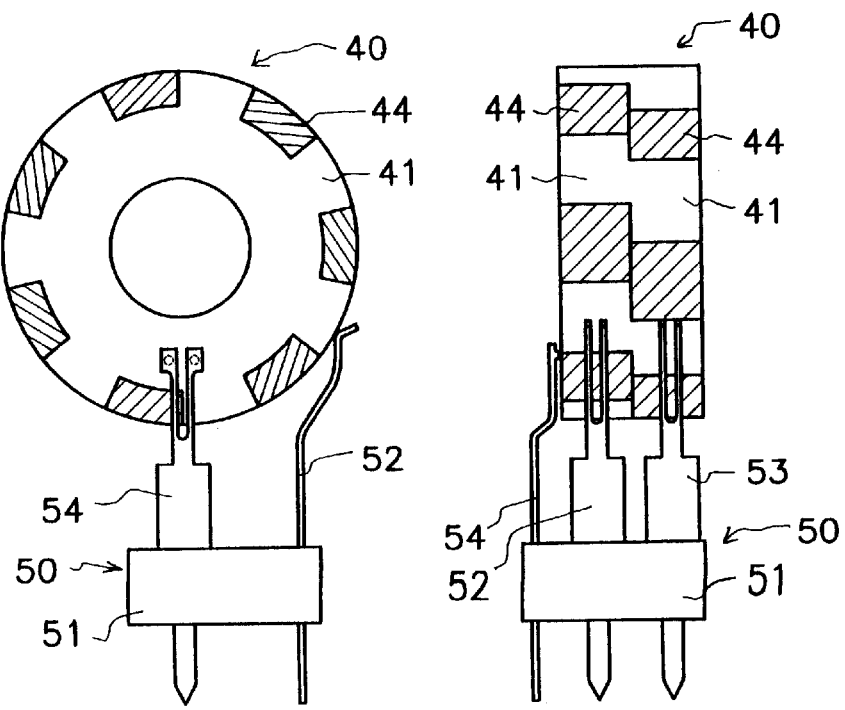
FIG. 6 depicts another embodiment of the present invention.

Referring to FIG. 6, still another preferred embodiment of the present invention is depicted. The signal-separating wheel 40 is formed in the manner described in detail below. Two identical plates having a first conductive portion 41 are combined. However, the first conductive portion 41 of the right plate is misaligned to that of the left plate. Thus several ladders, consisting of the first conductive portion 41 of the right plate and that of the left plate, are formed on the side of the signal-separating wheel 40. Then the recess of the right plate and the recess of the left plate are filled with insulating material to form insulating portions 44 of the signal separating wheel 40. The common terminal 54 is permanently coupled to the main surface of the first conductive portion 41. The first terminal 52 is coupled to the left plate and the second terminal 53 is coupled to the right plate, respectively. The first terminal 52 and the second terminal 53 are placed at the same level. Hence, the first terminal 52 and the second terminal 53 can receive the "ON" signal or the "OFF" signal, respectively. The "ON" signal and the "OFF" signal constitute a continuous digital logic signal so that the integrated circuit (IC) can be responsive to it.

That is to say, the embodiment shown in FIG. 5 makes use of the first terminal 52 and the second terminal 53 having different length, respectively. Conversely, the embodiment shown in FIG. 6 illustrates the combination of two identical plates and makes use of the first terminal 52 and the second terminal 53 placed at the same level.

Figure 9:
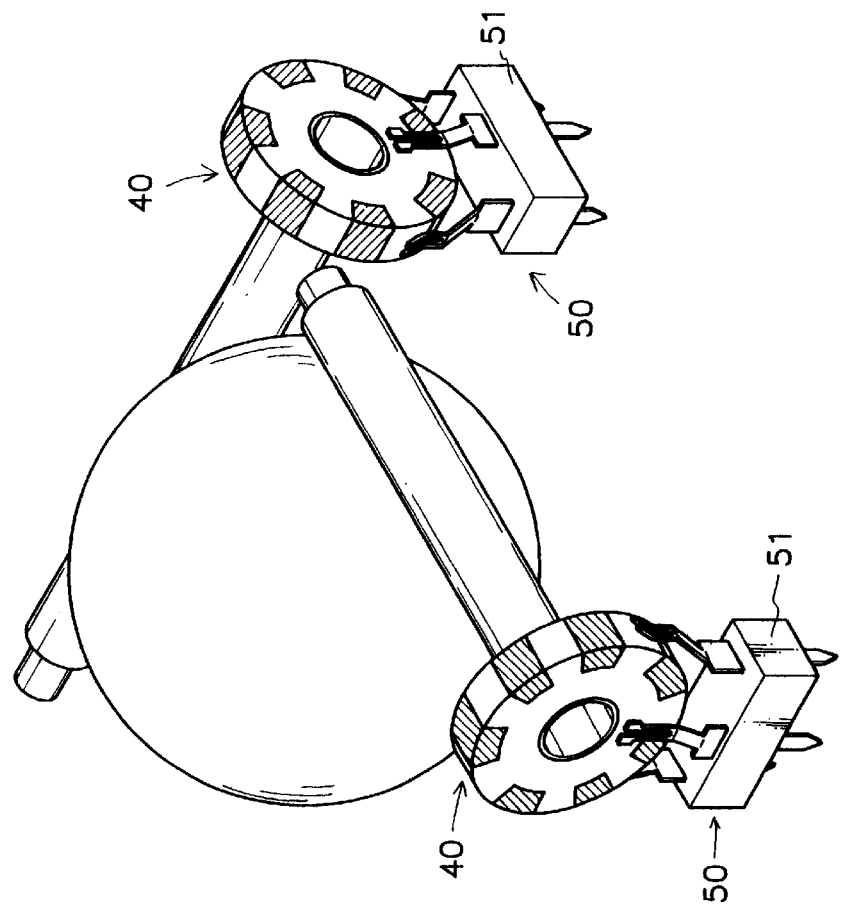
FIG. 9 depicts the scroll ball utilizing the mechanical coder disclosed by the present invention.
Figure 8:
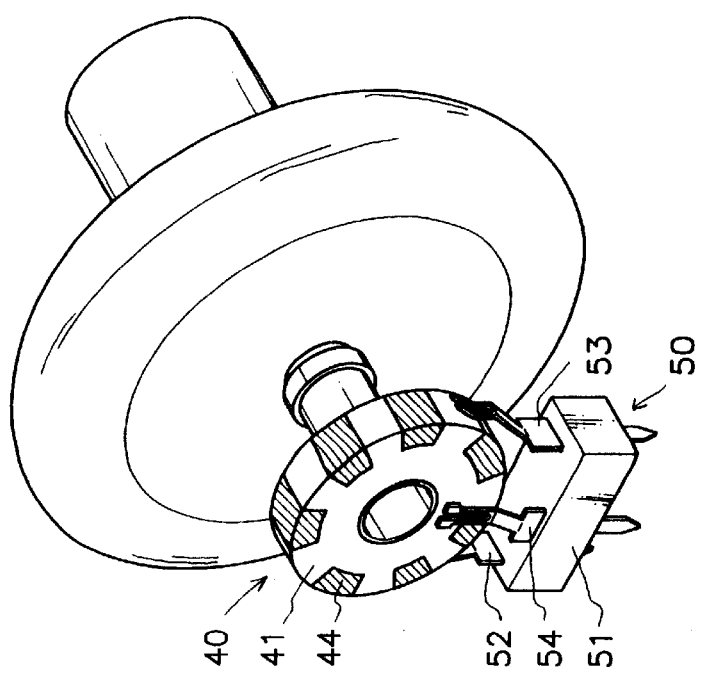
FIG. 8 depicts the scroll wheel utilizing the mechanical coder disclosed by the present invention.

Referring to FIG. 8, a scroll wheel of the mouse employing the present invention shown in FIG. 4 is depicted. The so-called scroll wheel is generally applied to drag the bar of window. Referring to FIG. 9, a scroll ball of the mouse employing the present invention shown in FIG. 4.

The application of the present invention is not limited to a device employing the scroll wheel or the scroll ball. Any apparatus employing the coder is suitable for the present invention.

According to the above-mentioned description, the present invention discloses a mechanical coder providing the following advantages. The bounce of the terminal, caused by the altitude formed between the conductive portion and the insulating portion, is avoided. Owing to the first terminal and the second terminal being coupled to the side of the signal-separating wheel, respectively, rather than being placed on a main surface of the signal-separating wheel, the suppression of the rotating of signal-separating wheel caused by the first terminal and the second terminal is avoided. The first terminal, the second terminal and the common terminal are combined to form a terminal module. Hence, the assembling time and the production cost are reduced effectively and the yield is improved.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

What is claimed is:

1. A mechanical coder comprising:

a signal-separating wheel, said signal-separating wheel having a smooth main surface, said signal-separating wheel further comprising a conductive portion having a gear-shaped outline and a plurality of recesses, each of said conductive portion is filled with insulating material to form a plurality of insulating portion; and a terminal module, comprising a base, a first terminal, a second terminal and a common terminal, one end of said common is coupled to said conductive portion and separated from said insulating portion, said first terminal and said second terminal are coupled to opposite sides of the gear-shaped outline of said signal-separating wheel, respectively.

* * * * *